US012282060B2

United States Patent
Khoo et al.

(10) Patent No.: US 12,282,060 B2
(45) Date of Patent: Apr. 22, 2025

(54) APPARATUS FOR TESTING SEMICONDUCTOR DEVICES AND A ROLLING CONTACTOR FOR USE IN SUCH AN APPARATUS

(71) Applicant: Infineon Technologies AG, Neubiberg (DE)

(72) Inventors: Nee Wan Khoo, Melaka (MY); Soon Lai Kho, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 122 days.

(21) Appl. No.: 18/119,921

(22) Filed: Mar. 10, 2023

(65) Prior Publication Data
US 2023/0314502 A1    Oct. 5, 2023

(30) Foreign Application Priority Data
Mar. 29, 2022   (DE) .................. 10 2022 107 387.4

(51) Int. Cl.
G01R 31/28      (2006.01)
G01R 1/073      (2006.01)
G01R 3/00       (2006.01)

(52) U.S. Cl.
CPC ..... *G01R 31/2887* (2013.01); *G01R 31/2863* (2013.01); *G01R 31/2867* (2013.01)

(58) Field of Classification Search
CPC .. G01R 3/00; G01R 31/2887; G01R 1/07314; G01R 1/07307
See application file for complete search history.

(56) References Cited

U.S. PATENT DOCUMENTS

| | | | |
|---|---|---|---|
| 3,579,102 A | 5/1971 | Keating et al. | |
| 3,676,777 A | 7/1972 | Charters | |
| 2003/0090279 A1 | 5/2003 | Garcia et al. | |
| 2003/0092365 A1* | 5/2003 | Grube | B08B 7/0028 451/178 |
| 2004/0056675 A1* | 3/2004 | Markert | G01R 31/2886 324/750.19 |

(Continued)

FOREIGN PATENT DOCUMENTS

| | | |
|---|---|---|
| CN | 1 02 253 349 | 11/2011 |
| CN | 210665889 | 6/2020 |
| GB | 2052098 | 1/1981 |

*Primary Examiner* — Jermele M Hollington
*Assistant Examiner* — Temilade S Rhodes-Vivour
(74) *Attorney, Agent, or Firm* — Dicke, Billig & Czaja, PLLC

(57) ABSTRACT

An apparatus for testing semiconductor devices is disclosed. In one example, the apparatus includes a rolling contactor comprising a first cylindrical rotatable holder, a plurality of test pin sets, each one of the test pin sets being connected to the cylindrical rotatable holder. Each one of the test pin sets comprises a plurality of test pins, and a substrate configured to support a plurality of semiconductor devices. The semiconductor devices comprising one or more contact elements on a main surface thereof remote from the substrate, wherein the first cylindrical rotatable holder and the substrate are arranged relative to each other so that due to a rotating movement of the first cylindrical rotatable holder the test pins of the test pin sets are successively contacted with the contact elements of the semiconductor devices.

16 Claims, 3 Drawing Sheets

(56) References Cited

U.S. PATENT DOCUMENTS

| | | | |
|---|---|---|---|
| 2005/0088198 A1* | 4/2005 | Nakano | G09G 3/006 324/755.01 |
| 2006/0214655 A1* | 9/2006 | Ham | G01R 31/2893 324/757.04 |
| 2007/0080700 A1 | 4/2007 | Kolman | |
| 2008/0180117 A1 | 7/2008 | Garcia | |
| 2010/0301889 A1* | 12/2010 | Sakata | G01R 31/2889 324/756.07 |
| 2013/0257471 A1* | 10/2013 | Lee | G01R 31/2808 324/757.02 |
| 2014/0111235 A1* | 4/2014 | Kikuchi | G01R 1/02 324/750.23 |

\* cited by examiner

APPARATUS FOR TESTING SEMICONDUCTOR DEVICES AND A ROLLING CONTACTOR FOR USE IN SUCH AN APPARATUS

CROSS-REFERENCE TO RELATED APPLICATION

This Utility patent application claims priority to German Patent Application No. 10 2022 107 387.4 filed Mar. 29, 2022, which is incorporated herein by reference.

TECHNICAL FIELD

The present invention relates to an apparatus for testing semiconductor devices and a rolling contactor for use in such an apparatus.

BACKGROUND

For electrical testing semiconductor devices a set of microscopic contacts or probes, usually called a probe card, are held in place whilst the substrate, e.g. a wafer, supporting the devices is moved into electrical contact. When a die (or array of dice) have been electrically tested the prober moves the substrate to the next die (or array) and the next test can start.

With regard to the speed of testing, the decisive factor is the quantity "unit per hour" (UPH), which is determined by influence by the test time and the index time. Index time is the time between EOT (end of test)→SOT (start of test), i.e. time needed to remove tested devices from the test position and replace them with untested devices in the test position. With the advancement of automatic test equipment and with a higher test parallelism, effective test time per test is reducing. The higher test parallelism also helps to reduce effective index time per DUT. However, with larger strip/panel/wafer and higher test parallelism, the corresponding handling mechanism is also getting heavier and cannot move much faster.

In general the mechanical contact between the device to be tested and the contactor is established by vertical movement of the chuck. After each test touchdown, the chuck needs to move away from contactor, then move the device into next test position, and lastly move vertically toward contactor again for test contact. To complete these 3 movements with precision, significant time is needed. Such mechanical movement time (index time), is an adder to test cycle time which directly affects the UPH.

For these and other reasons there is a need for the present disclosure.

SUMMARY

A first aspect of the present disclosure is related to a an apparatus for testing semiconductor devices. The apparatus comprises a rolling contactor comprising a first cylindrical rotatable holder, a plurality of test pin sets, each one of the test pin sets being connected to the cylindrical rotatable holder, and each one of the test pin sets comprising a plurality of test pins, and a substrate configured to support a plurality of semiconductor dies. The semiconductor dies comprising one or more contact elements on a main surface thereof remote from the substrate, wherein the first cylindrical rotatable holder and the substrate are arranged relative to each other so that due to a rotating movement of the first cylindrical rotatable holder the test pins of the test pin sets are successively contacted with the contact elements of the semiconductor dies.

A second aspect of the present disclosure is related to a rolling contactor for use in an apparatus for testing semiconductor devices, the rolling contactor comprising a first cylindrical rotatable holder, a plurality of test pin sets, each one of the test pin sets being connected to the first cylindrical rotatable holder, and each one of the test pin sets comprising a plurality of test pins.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

Figure 1:
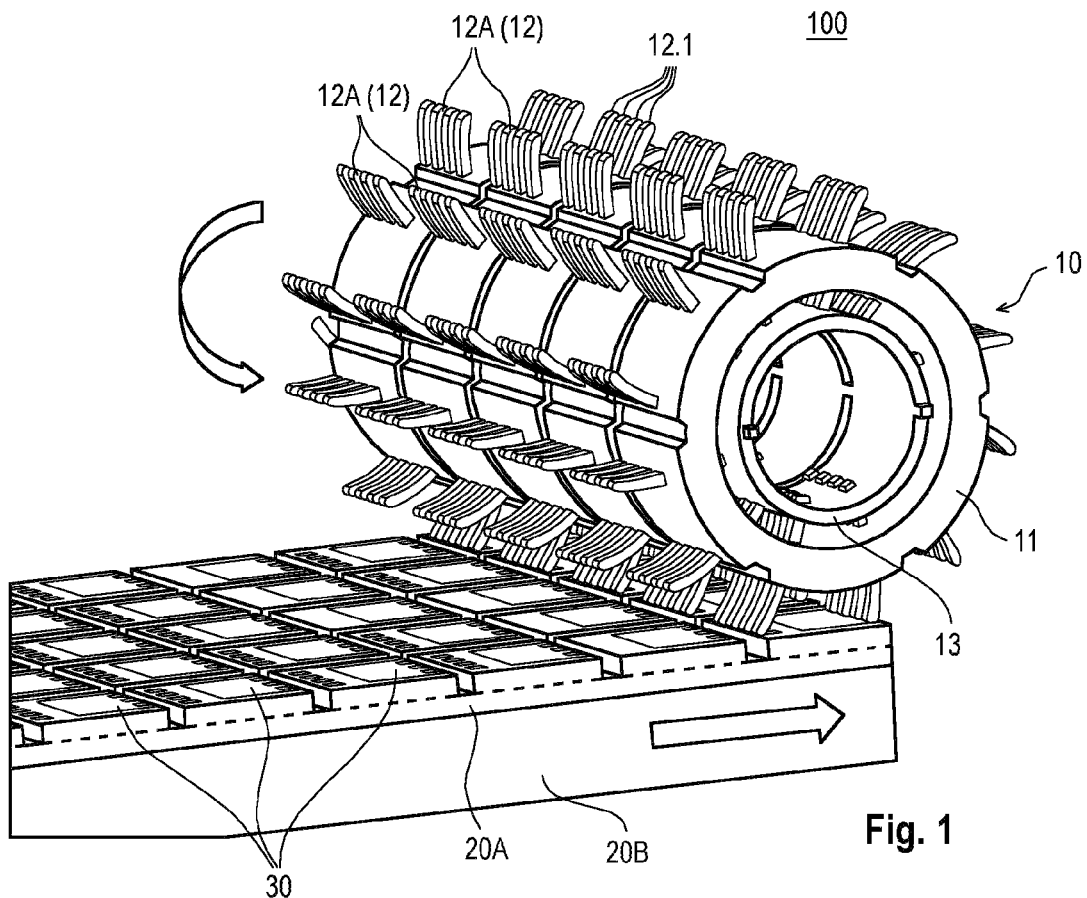
FIG. 1 shows a perspective view on an apparatus for testing semiconductor devices in which subgroups of test pin sets are arranged along a straight line on an outer circumferential surface of the first rotatable cylindrical holder, the straight line being parallel to a cylindrical axis of the first cylindrical rotatable holder.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

FIG. 1 shows a perspective view on an apparatus for testing semiconductor devices in which subgroups of test pin sets are arranged along a straight line on an outer circumferential surface of the first rotatable cylindrical holder, the straight line being parallel to a cylindrical axis of the first cylindrical rotatable holder.

More specifically, FIG. 1 shows an apparatus 100 for testing semiconductor devices, the apparatus 100 comprising a substrate 20B configured to support a plurality of semiconductor devices 30. The substrate 20B can in principle be any kind of a movable substrate 20B. For example, the semiconductor devices 30 may still be contiguously arranged in the form of semiconductor dies 30 on a semiconductor wafer 20A or other kind of device holder 20A and the substrate 20B in this case may be a wafer holder 20B or a wafer support plate 20B. Alternatively, the semiconductor devices 30 may already be separated in the form of discrete packages, chips or dies and arranged on a substrate such as a circulating conveyor belt or a flexible printed circuit board (PCB). If, for example, the semiconductor devices 30 are molded packages in strip form, then as a substrate a so-called plunger is used.

In the present embodiment as shown in FIG. 1 the substrate 20B is moving in the right direction as indicated by the arrow. As already mentioned above, the substrate 20B supports a plurality of semiconductor devices 30 which can be any kind of devices like e.g. semiconductor packages, semiconductor chips or semiconductor dies. The semiconductor devices comprise contact pads or contact elements which shall be used as contact points for the testing apparatus.

The apparatus 100 further comprises a rolling contactor 10 comprising a first cylindrical rotatable holder 11, a plurality of test pin sets 12, each one of the test pin sets 12 being connected to the cylindrical rotatable holder 11, and each one of the test pin sets 12 comprising a plurality of test pins 12.1, and the semiconductor devices 30 comprising one or more contact elements on a main surface thereof remote from the substrate 20B, wherein the first cylindrical rotatable holder 11 and the substrate 20B are arranged relative to each other so that due to a rotating movement of the first cylindrical rotatable holder 11 the test pins 12.1 of the test pin sets 12 are successively contacted with the contact pads or contact elements of the semiconductor devices 30. This is accomplished by moving the substrate 20B to the right and by setting the first cylindrical rotatable holder 11 into a counterclockwise rotating motion. In this case the first cylindrical rotatable holder 11 is stationary which means that it does not move laterally and its axis is fixed. In another embodiment it is also possible that the substrate is stationary and the first cylindrical rotatable holder is moving horizontally at the same time.

As can further be seen in the embodiment of FIG. 1, the plurality of test pin sets 12 comprises a plurality of subgroups 12A of test pin sets 12, wherein each one of the plurality of subgroups 12A of test pin sets 12 is arranged along a straight line on an outer circumferential surface of the first rotatable cylindrical holder 11, the straight line being parallel to a cylindrical axis of the first cylindrical rotatable holder 11. Each one of the subgroups 12A comprises four test pins 12.1 along the straight line intended to make contact with the four contact pads of the semiconductor devices 30. Of course, there can also be fewer or more than four test pins 12.1 in each subgroup 12A depending on the number of contact pads in the semiconductor devices 30.

It should be added that further embodiments are possible in which the contact elements or pads are not arranged along a straight, but perhaps along a zig-zag pattern. In this case of course also the test pins within the respective subgroup would have to be arranged along a zig-zag pattern.

The test pins 12.1 can be conventional test pins like, for example, cantilever test pins, pogo pins, or any other probe pins intended to make contact with the contact elements.

The rolling contactor 10 can be divided into a number of annular portions, five annular sections in the embodiment example of FIG. 1. Of course, there can also be fewer or more than five annular sections. Within these annular portions the subgroups 12A of test pin sets 12, as shown in FIG. 1, may be concentrically arranged around the first rotatable holder 11. Also within each one of these annular portions adjacent subgroups 12A are spaced from each other by predetermined angular amounts on the surface of the first cylindrical holder 11. These angular amounts correspond to the distances of the contact elements of the semiconductor devices 30 along a row of the semiconductor devices 30 arranged on the substrate 20B. Thus, the subgroups 12A within each one of the annular portions are determined to make contact with semiconductor devices 30 along one row of semiconductor devices 30.

In a further embodiment it will be shown and described below, that further subgroups of test pin sets can also be arranged along a straight line which is perpendicular to the cylindrical axis of the first rotatable cylindrical holder so that semiconductor devices can be tested which have contact elements at 3 or 4 sides. In quite another embodiment only subgroups of test pin sets are provided which are arranged along a straight line which is perpendicular to the cylindrical axis of the first cylindrical rotatable holder.

The first cylindrical rotatable holder 11 can be arranged stationary which means that it does not move laterally and its axis is fixed and the substrate 20B can be movable along a direction perpendicular to a cylindrical axis of the first cylindrical rotatable holder 11. In the embodiment of FIG. 1 the substrate 20B is moving in the right direction as is indicated by the arrow.

The test pins 12.1 can be oriented essentially radially outwards from the first cylindrical rotatable holder 11. They can in particular extend through a wall of the first cylindrical rotatable holder 11.

Figure 2A:
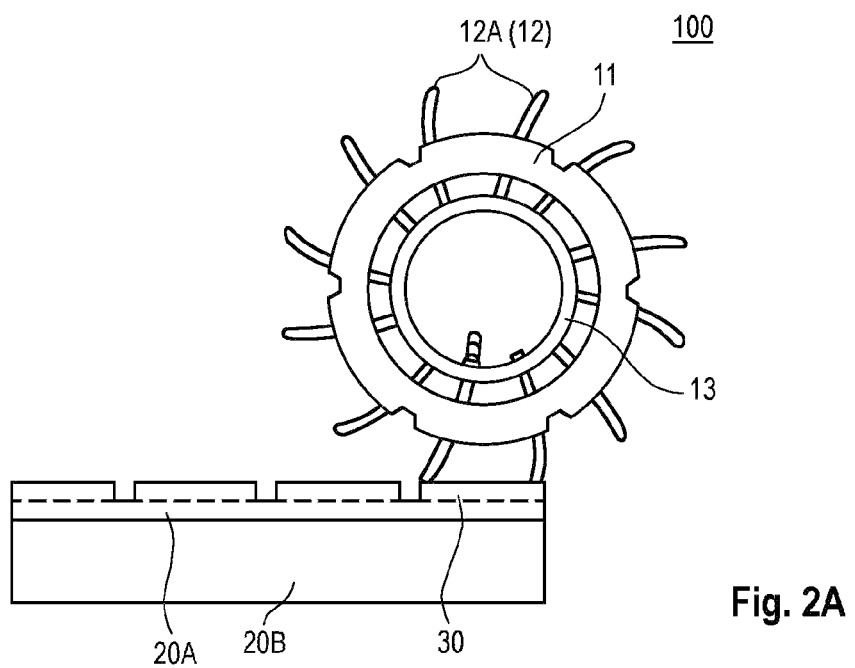
FIG. 2 comprises FIGS. 2A and 2B and shows a cross-sectional side view on a section of the apparatus of FIG. 1, the section containing the rolling contactor and a portion of the substrate (2A), and an enlarged section thereof (2B).
Figure 2B:
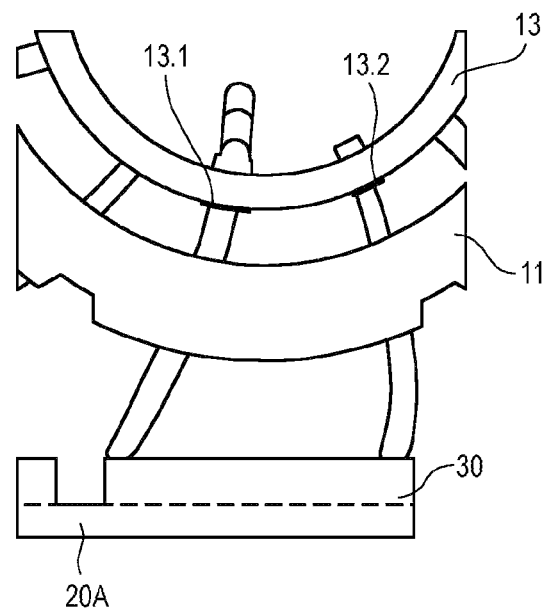

FIG. 2 comprises FIGS. 2A and 2B and shows a cross-sectional side view on a section of the apparatus of FIG. 1, the section containing the rolling contactor and a portion of the substrate (2A), and an enlarged section thereof (2B).

As can be seen in FIG. 2A, the rolling contactor 10 further comprises a second cylindrical holder 13 a portion was already to be seen in FIG. 1. The second cylindrical holder 13 comprises in each one of the annular portions of the rolling contactor 10 two conductive elements 13.1 and 13.2 disposed on an outside of a wall of the second cylindrical holder 13. The conductive elements 13.1 and 13.2 are configured so that a respective inner end of the test pins 12.1 can make a sliding and/or electrical contact with the conductive elements 13.1 and 13.2. The contact elements 13.1 and 13.2 can e.g. be comprised of conductive layers or pads. A testing circuit (not shown) may be further connected with the conductive elements 13.1 and 13.2 by means of an electrical via connection through the wall of the second cylindrical holder 13.

According to the embodiment of FIGS. 1 and 2, each of the semiconductor devices 30 comprises two rows of contact elements arranged on opposite sides of the semiconductor device. Thus, during each test phase, respective two subgroups 12A of the test pins 12.1 are connected to the contact elements of the semiconductor device 30.

It can be provided that the first cylindrical rotatable holder 11 is set into a continuous and steady rotation with constant speed, i.e. without interruptions. In this case, the only momentary sliding contact between the test pins 12.1 and the conductive elements 13.1 and 13.2 is sufficient to perform the test. However, it is also possible to stop the rotation as soon as contact is made and to carry out the test when the first cylindrical rotatable holder is at a standstill.

Figure 3:
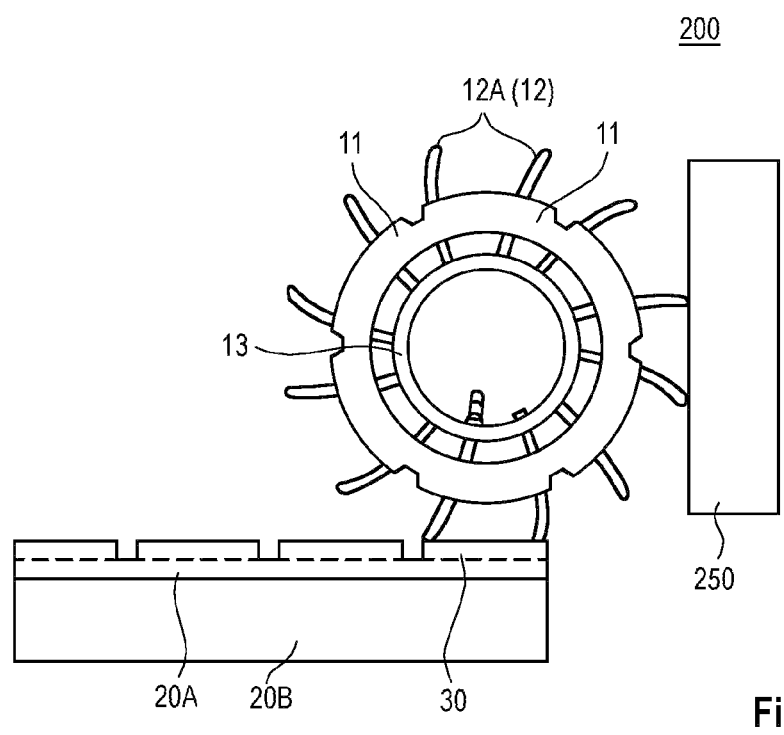
FIG. 3 shows a cross-sectional side view on a section of an apparatus for testing semiconductor devices, the section containing the rolling contactor, a portion of a substrate supporting a plurality of semiconductor devices, and a cleaning module being arranged such that the test pins make contact with the cleaning module at every revolution.

FIG. 3 shows a cross-sectional side view on a section of an apparatus for testing semiconductor devices, the section containing the rolling contactor, a portion of a substrate supporting a plurality of semiconductor devices, and a cleaning module being arranged such that the test pins make contact with the cleaning module at every revolution. It can be provided that the test pins are contacted with the cleaning module at each rotation. It can be provided that the test pins are contacted with the cleaning module after testing at least part of the semiconductor devices, e.g. at each rotation. Alternatively, the cleaning module can be moved laterally and only approach the rolling contactor at predefined intervals.

More specifically, FIG. 3 shows an apparatus 200 for testing semiconductor devices, the apparatus 200 comprising a rolling contactor 10 and a substrate 20B which can both be constructed in the same way as the apparatus 100 of FIGS. 1 and 2 so that the same reference signs were used and the description of the members and elements will not be repeated here. Also in this embodiment, it may be provided that the rolling contactor is laterally movable and the substrate is stationary, so that in this case the rolling contactor comes into contact with the cleaning module only once in the position shown.

In addition to this, the apparatus 200 further comprises a cleaning or conditioning module 250 being arranged such that the test pins 12.1 of each one of the subgroups 12A make contact with the module 250 at every revolution. With this the contacting performance, e.g. the contact resistance, can be maintained and a high contact yield can be achieved without the need of downtime for offline cleaning. The cleaning module 250 can, for example, comprise a brush, in particular a nylon brush, or a cleaning sheet which may or may not contain a fine abrasive.

Figure 4:
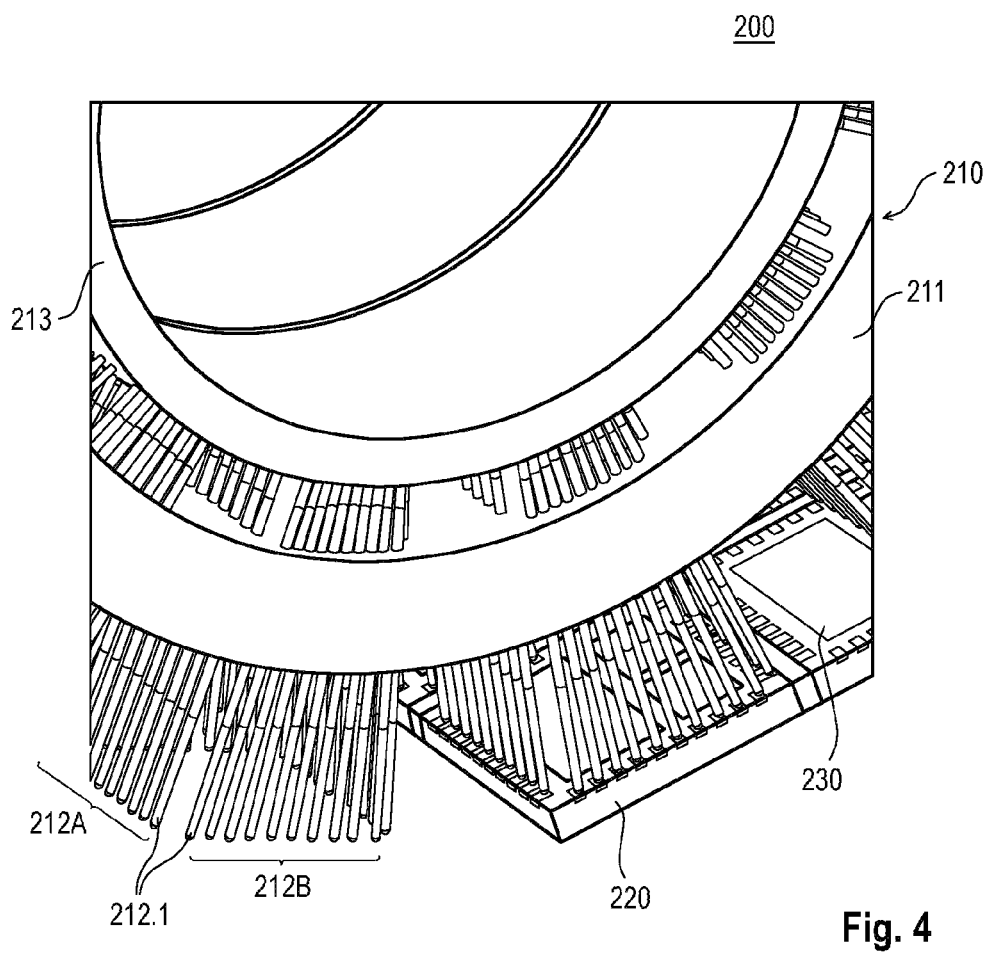
FIG. 4 shows a perspective view on an apparatus for testing semiconductor devices in which subgroups of test pin sets are arranged along two straight lines on an outer circumferential surface of the first rotatable cylindrical holder, the straight lines being parallel and perpendicular to a cylindrical axis of the first cylindrical rotatable holder.

FIG. 4 shows a perspective view on a portion of an apparatus for testing semiconductor devices in which subgroups of test pin sets are arranged along two straight lines on an outer circumferential surface of the first rotatable cylindrical holder, the straight lines being parallel and perpendicular to a cylindrical axis of the first cylindrical rotatable holder.

More specifically, FIG. 4 shows an apparatus 200 for testing semiconductor devices, the apparatus 200 comprising a rolling contactor 210 comprising a first cylindrical rotatable holder 211, a plurality of test pin sets 212, each one of the test pin sets 212 being connected to the cylindrical rotatable holder 211, and each one of the test pin sets 212 comprising a plurality of test pins 212.1, and a substrate 220 configured to support a plurality of semiconductor devices 230, the semiconductor devices 230 comprising one or more contact elements on a main surface thereof remote from the substrate 220, wherein the first cylindrical rotatable holder 211 and the substrate 220 are arranged relative to each other so that due to a rotating movement of the first cylindrical rotatable holder 211 the test pins 212.1 of the test pin sets 212 are successively contacted with the contact elements of the semiconductor devices 230.

A difference to the previously described embodiments is that the plurality of test pin sets 212 comprises two different pluralities of subgroups 212A of test pin sets 212. A first plurality of subgroups 212A of test pin sets 212 is arranged along a straight line on an outer circumferential surface of the first rotatable cylindrical holder 211, the straight line being parallel to a cylindrical axis of the first cylindrical rotatable holder 211. A second plurality of subgroups 212B of test pin sets 212 is arranged along a straight line on an outer circumferential surface of the first cylindrical rotatable holder 211, the straight line being perpendicular to a cylindrical axis of the first cylindrical rotatable holder 211.

It was already mentioned above that the semiconductor devices 230 can be of any kind, any construction and shape. In the embodiment as shown in FIG. 4 the semiconductor devices 230 can, for example, so-called Quad Flat No Leads Packages (QFN), which are known to have contact elements along all four edges. With the apparatus of FIG. 4 having the two different pluralities of subgroups it is possible to test QFN packages.

It should be added that it is also possible to provide an apparatus in which a rolling contactor comprises only one plurality of subgroups which extend along a straight which is perpendicular to the cylindrical axis of the rolling contactor.

Examples

In the following specific examples of the present disclosure are described.

Example 1 is an apparatus for testing semiconductor devices, the apparatus comprising a rolling contactor comprising a first cylindrical rotatable holder, a plurality of test pin sets, each one of the test pin sets being connected to the cylindrical rotatable holder, and each one of the test pin sets comprising a plurality of test pins, and a substrate configured to support a plurality of semiconductor devices, the semiconductor devices comprising one or more contact elements on a main surface thereof remote from the substrate, wherein the first cylindrical rotatable holder and the substrate are arranged relative to each other so that due to a rotating movement of the first cylindrical rotatable holder the test pins of the test pin sets are successively contacted with the contact elements of the semiconductor devices.

Example 2 is apparatus according to Example 1, wherein the plurality of test pin sets comprises a plurality of subgroups of test pin sets, wherein each one of the plurality of subgroups of test pin sets is arranged along a straight line on an outer circumferential surface of the first rotatable cylindrical holder, the straight line being parallel to a cylindrical axis of the first cylindrical rotatable holder, the straight line being parallel and/or perpendicular to a cylindrical axis of the first cylindrical rotatable holder.

Example 3 is the apparatus according to Example 1 or 2, comprising one, two, three, or four subgroups of test pin sets for testing semiconductor devices having contact elements on one, two, three, or four sides.

Example 4 is the apparatus according to Example 2 or 3, wherein adjacent subgroups of the test pin sets are spaced apart from each other by a defined angular amount around the circumference of the first cylindrical rotatable holder.

Example 5 is the apparatus according to any one of the preceding Examples, wherein the first cylindrical rotatable holder does not move laterally and the substrate is movable along a direction perpendicular to a cylindrical axis of the first cylindrical rotatable holder.

Example 6 is the apparatus according to any one of the preceding claims, wherein the test pins are oriented essentially radially outwards from the first cylindrical rotatable holder.

Example 7 is the apparatus according to any one of the preceding Examples, wherein the test pins extend through a wall of the first cylindrical rotatable holder.

Example 8 is the apparatus according Example 7, wherein the rolling contactor comprises a second cylindrical holder comprising at least one conductive element on an outside of a wall thereof, wherein the conductive element (13.1) is configured so that an inner end of a test pin can make an electrical contact, in particular a sliding contact, with the conductive element.

Example 9 is the apparatus according Example 8, further comprising a testing circuit connected with the conductive element by means of an electrical via connection through the wall of the second cylindrical holder.

Example 10 is the apparatus according to any one of the preceding claims, further comprising a cleaning or conditioning module being arranged such that the test pins make contact with the cleaning or conditioning module either periodically, as needed or on demand, or after testing at least part of the plurality of semiconductor devices.

Example 11 is a rolling contactor for use in an apparatus for testing semiconductor devices, the rolling contactor comprising a first cylindrical rotatable holder, a plurality of test pin sets, each one of the test pin sets being connected to the first cylindrical rotatable holder, and each one of the test pin sets (12) comprising a plurality of test pins.

Example 12 is the rolling contactor according to Example 10, wherein the plurality of test pin sets comprises a plurality of subgroups of test pin sets, wherein each one of the plurality of subgroups of test pin sets is arranged along a straight line on an outer circumferential surface of the first rotatable cylindrical holder, the straight line being parallel and/or perpendicular to a cylindrical axis of the first cylindrical rotatable holder.

Example 13 is the rolling contactor according to Example 12, comprising one, two, three, or four subgroups of test pin sets for testing semiconductor devices having contact elements on one, two, three, or four sides.

Example 14 is the rolling contactor according to Example 12 or 13, wherein adjacent subgroups of the test pin sets are spaced apart from each other by a defined angular amount around the circumference of the first cylindrical rotatable holder.

Example 15 is the rolling contactor according to any one of Examples 11 to 14, wherein the first cylindrical rotatable holder does not move laterally and the substrate is movable along a direction perpendicular to a cylindrical axis of the first cylindrical rotatable holder.

Example 16 is the rolling contactor according to any one of Examples 11 to 15, wherein each one of the test pins is oriented essentially radially outwards from the first cylindrical rotatable holder.

Example 17 is the rolling contactor according to any one of Examples 11 to 16, wherein each one of the test pins extends through a wall of the first cylindrical rotatable holder.

Example 18 is the rolling contactor according to Example 17, further comprising a second cylindrical holder comprising at least one conductive layer on an outside of a wall thereof, wherein the conductive layer is configured so that so that an inner end of a test pin can make a sliding contact with the conductive layer.

Example 19 is the rolling contactor according to Example 18, further comprising a testing circuit connected with the conductive layer by means of an electrical via connection through the wall of the second cylindrical holder.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. An apparatus for testing semiconductor devices, the apparatus comprising:
   a rolling contactor comprising:
      a first cylindrical rotatable holder;
      a plurality of test pin sets, each one of the test pin sets being connected to the first cylindrical rotatable holder, and each one of the test pin sets comprising a plurality of test pins; and
   a substrate configured to support a plurality of semiconductor devices, the semiconductor devices comprising one or more contact elements on a main surface thereof remote from the substrate; wherein
   the first cylindrical rotatable holder and the substrate are arranged relative to each other so that due to a rotating movement of the first cylindrical rotatable holder the test pins of the test pin sets are successively contacted with the contact elements of the semiconductor devices;
      wherein the test pins extend through a wall of the first cylindrical rotatable holder; and
      wherein the rolling contactor comprises a second cylindrical holder comprising at least one conductive element on an outside of a wall thereof, wherein the conductive element is configured so that an inner end of a test pin can make an electrical contact, in particular a sliding contact, with the conductive element.

2. The apparatus according to claim 1, wherein
   the plurality of test pin sets comprises a plurality of subgroups of test pin sets, wherein each one of the plurality of subgroups of test pin sets is arranged along a straight line on an outer circumferential surface of the first rotatable cylindrical holder, the straight line being parallel and/or perpendicular to a cylindrical axis of the first cylindrical rotatable holder.

3. The apparatus according to claim 1, comprising:
   one, two, three, or four subgroups of test pin sets for testing semiconductor devices having contact elements on one, two, three, or four sides.

4. The apparatus according to claim 2, wherein
   adjacent subgroups of the test pin sets are spaced apart from each other by a defined angular amount around the circumference of the first cylindrical rotatable holder.

5. The apparatus according to claim 1, wherein
   the first cylindrical rotatable holder does not move laterally and the substrate is movable along a direction perpendicular to a cylindrical axis of the first cylindrical rotatable holder.

6. The apparatus according to claim 1, wherein
   the test pins are oriented essentially radially outwards from the first cylindrical rotatable holder.

7. The apparatus according claim 1, further comprising:
   a testing circuit connected with the conductive element by means of an electrical via connection through the wall of the second cylindrical holder.

8. The apparatus according to claim 1, further comprising:
   a cleaning or conditioning module being arranged such that the test pins make contact with the cleaning or conditioning module either periodically, as needed or on demand, or after testing at least part of the plurality of semiconductor devices.

9. A rolling contactor for use in an apparatus for testing semiconductor devices, the rolling contactor comprising:
   a first cylindrical rotatable holder; and
   a plurality of test pin sets, each one of the test pin sets being connected to the first cylindrical rotatable holder, and each one of the test pin sets comprising a plurality of test pins;
      wherein each one of the test pins extends through a wall of the first cylindrical rotatable holder, and
      wherein a second cylindrical holder comprising at least one conductive layer on an outside of a wall thereof, wherein the conductive layer is configured se that so that an inner end of a test pin can make sliding contact with the conductive layer.

10. The rolling contactor according to claim 9, wherein
    the plurality of test pin sets comprises a plurality of subgroups of test pin sets, wherein each one of the plurality of subgroups of test pin sets is arranged along a straight line on an outer circumferential surface of the first rotatable cylindrical holder, the straight line being parallel and/or perpendicular to a cylindrical axis of the first cylindrical rotatable holder.

11. The rolling contactor according to claim 10, comprising:
    one, two, three, or four subgroups of test pin sets for testing semiconductor devices having contact elements on one, two, three, or four sides.

12. The rolling contactor according to claim 10, wherein
    adjacent subgroups of the test pin sets are spaced apart from each other by a defined angular amount around the circumference of the first cylindrical rotatable holder.

13. The rolling contactor according to claim 9, wherein
    the first cylindrical rotatable holder does not move laterally and the substrate is movable along a direction perpendicular to a cylindrical axis of the first cylindrical rotatable holder.

14. The rolling contactor according to claim 9, wherein
    each one of the test pins is oriented essentially radially outwards from the first cylindrical rotatable holder.

15. The rolling contactor according to claim 9, further comprising:
   a testing circuit connected with the conductive layer by means of an electrical via connection through the wall of the second cylindrical holder.

16. A rolling contactor for testing semiconductor devices comprising:
   a first cylindrical rotatable holder;
   a plurality of test pins connected to the first cylindrical rotatable holder; and
   a second cylindrical holder disposed concentrically within the first cylindrical rotatable holder and including a plurality of conductive elements on an outside wall thereof, wherein each of the plurality of test pins extends through a wall of the first cylindrical rotatable holder so that an inner end of each test pin can make a sliding contact with a corresponding one of the conductive elements.

* * * * *